United States Patent [19]

Knoop et al.

[11] 3,967,199

[45] June 29, 1976

[54] METHOD AND APPARATUS FOR TESTING ELECTRIC MOTORS

[75] Inventors: Donald E. Knoop, Benton Harbor; Rodney F. Seeland, St. Joseph, both of Mich.

[73] Assignee: Whirlpool Corporation, Benton Harbor, Mich.

[22] Filed: Nov. 18, 1974

[21] Appl. No.: 524,494

[52] U.S. Cl. .................. 324/158 MG; 322/99
[51] Int. Cl.² .......................... G01R 31/02
[58] Field of Search ............. 324/158 MG, 158 R; 318/490; 322/99

[56] References Cited
UNITED STATES PATENTS

| | | | |
|---|---|---|---|
| 2,741,738 | 4/1956 | Reid | 324/158 MG |
| 3,004,205 | 10/1961 | Barritt et al. | 318/490 |

FOREIGN PATENTS OR APPLICATIONS

| | | | |
|---|---|---|---|
| 182,231 | 10/1966 | U.S.S.R. | 324/158 MG |

*Primary Examiner*—R. V. Rolinec
*Assistant Examiner*—Ernest F. Karlsen
*Attorney, Agent, or Firm*—Wegner, Stellman, McCord, Wiles & Wood

[57] ABSTRACT

To determine whether a motor is operative, where visual inspection of rotation is impossible or difficult, the motor is energized by connection to an AC source for a short interval to bring the motor to running speed. After lapse of the short interval the AC source is disconnected and the motor coasts to a stop. An AC detector determines that AC power has been terminated and closes a switch to connect a voltage detector to a memory. The voltage detector amplifies a residual EMF field generated while the motor is acting as a generator due to the presence of a residual magnetic field produced in the rotor during prior energization. The detected voltage sets the memory which energizes a motor rotation indicator.

10 Claims, 2 Drawing Figures

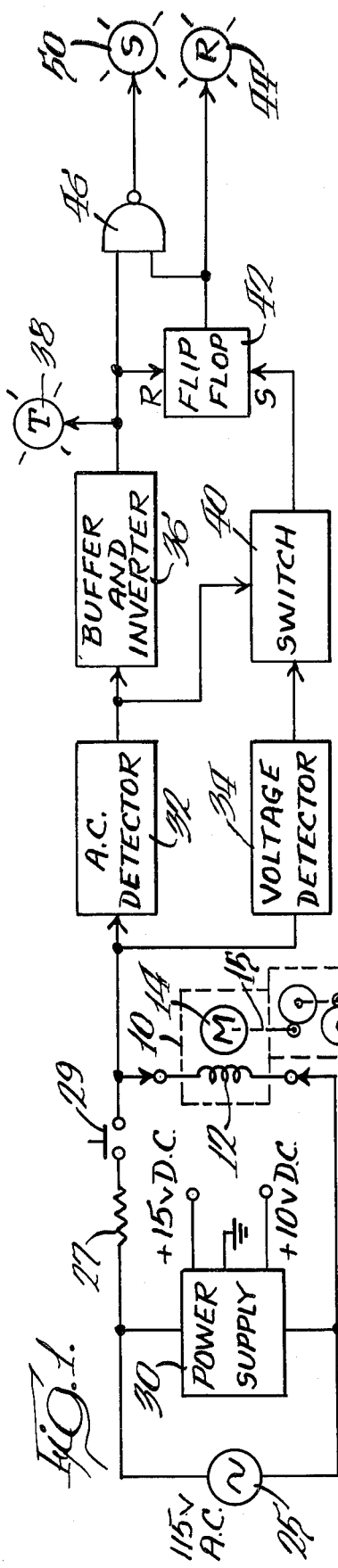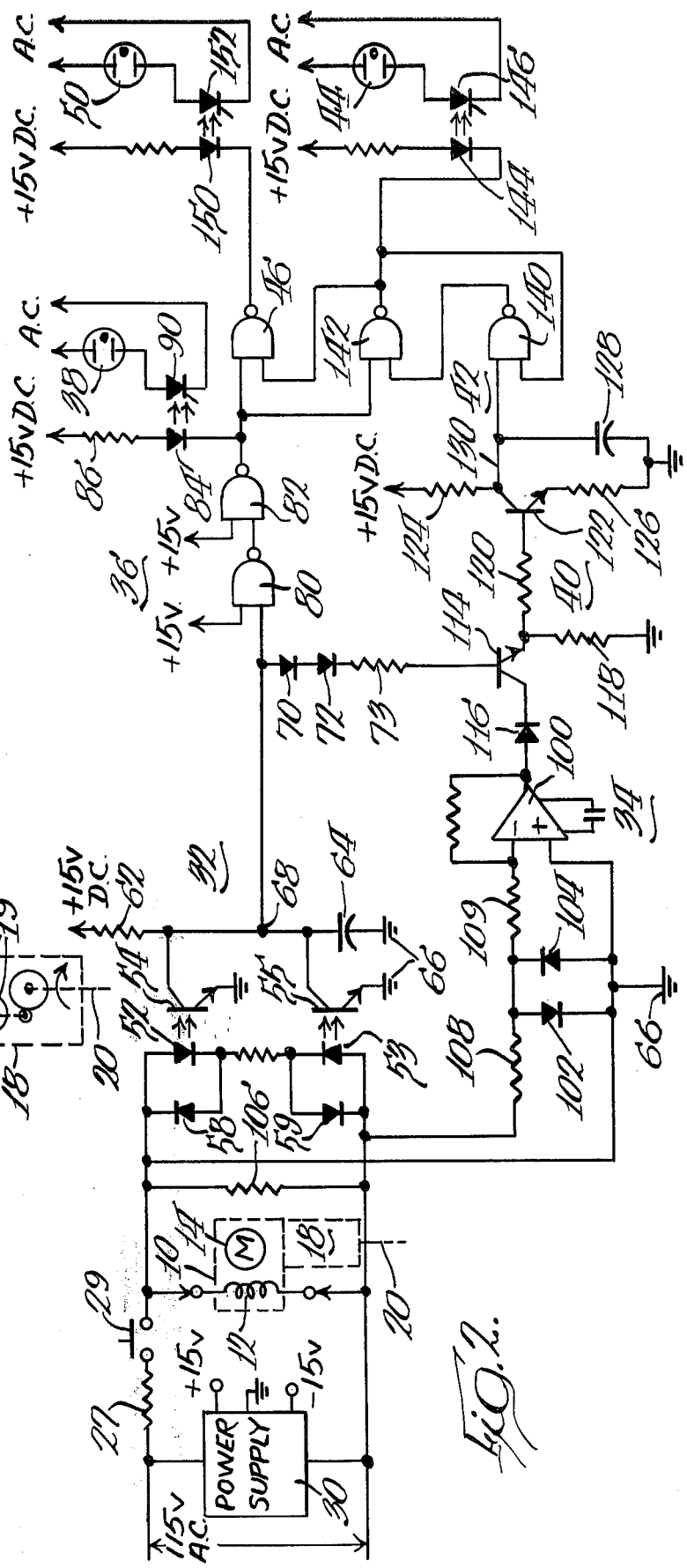

METHOD AND APPARATUS FOR TESTING ELECTRIC MOTORS

BACKGROUND OF THE INVENTION

This invention relates to a method and apparatus for testing an electric motor to determine over a short testing interval whether the motor is operative.

During final production testing of an electric motor, visual inspection of rotation of the motor may be possible or difficult for a variety of reasons. For example, rotation of an output shaft of a timing motor which drives a step-down gear train may be imperceptible over a short time period during which testing should be accomplished. Similarly, the motor may be part of an enclosed assembly which does not allow for any visual inspection of moving parts. It would be desirable to provide a testing method and apparatus which can determine, in an extremely short time interval, whether an electric motor is operative or inoperative. To maintain a high rate of production, the method must be simple and desirably should require no connection to the output shaft It has been known to utilize the residual magnetic field of an electric motor to operate an indicator to indicate that an appliance has completed a cycle. An example of such a device is disclosed in U.S. Pat. No. 3,004,205 issued Oct. 10, 1961 to Barritt and Fuqua, and assigned to the assignee of the present application. In the Barritt et al patent, the end of the cycle of an automatic clothes dryer is signaled by an audible indication which is generated in response to the momentary transient voltage induced in the winding of an electric motor by residual decaying circulating rotor currents existing in the rotating rotor immediately following de-energization of the motor.

SUMMARY OF THE INVENTION

In accordance with the present invention, a new method for testing electric motors is disclosed which uses the known property that an EMF is generated by a deenergized motor as it is coasting to a stop. The novel method includes initially energizing the motor for a short testing interval, which is sufficient to allow the motor rotor to come to operating speed. Upon termination of this testing interval, the motor is de-energized and a voltage detector is responsive to the generated EMF, if present, to set a memory so as to record the operative, or inoperative, condition of the motor.

One object of the present invention is the provision of an improved method for testing an electric motor by energizing the motor for a short time interval, detecting the presence of a generated EMF and enabling a memory to record the detected presence of the field after disappearance thereof.

Other objects and features of the invention will be apparent from the following description and from the drawings. While an illustrative embodiment of the invention is shown in the drawings and will be described in detail herein, the invention is susceptable of embodiment in many different forms and it should be understood that the present disclosure is to be considered as an exemplification of the principles of the invention and is not intended to limit the invention to the embodiment illustrated.

BRIEF DESCRIPTION OF THE DRAWINGS

FIG. 1 is a block diagram of a method and apparatus for testing an electric motor having an attached step-down gear train; and FIG. 2 is a schematic diagram showing in detail the apparatus of FIG. 1.

DESCRIPTION OF THE PREFERRED EMBODIMENT

Turning to FIG. 1, an electric motor 10 to be tested includes at least one stator winding 12 and a rotor 14 which rotates a motor shaft 15 upon connection of the winding 12 to a 115 volt AC source. In the embodiment shown the motor 10 comprises a small fractional-horsepower, single phase AC motor such as utilized in timing devices for appliances or for clocks. Connected to the motor shaft 15 is a step-down gear train 18 comprised of a plurality of speed reducing gear sections 19 which rotate an output shaft 20. The speed of rotation of output shaft 20 may be extremely slow, or even imperceptible over a short time interval of several seconds. Rapid visual inspection of the rotation of the output shaft 20 may be very difficult, or impossible if the motor is already located in a utilization device.

Electric motor 10 may take a variety of forms, and may include additional windings and a start capacitor or the like for initating rotation when connected across a single phase AC source. In fact, the testing method is applicable with three-phase AC motors of substantial size and in general has utility wherever rotation of an electric motor cannot be determined readily or quickly by visual inspection upon energization of the electric motor. The testing method is also applicable to electric motors which do not have a connected gear train, but do have a low rpm or are located in an appliance so as to make impossible or difficult any visual inspection.

In accordance with the present method and apparatus, a conventional source 25 or 115 volts AC is coupled through a resistor 27 and a test switch 29, when depressed, to test clips which are connected across the winding 12 of the motor. A DC power supply 30 is coupled directly across the AC source 25 to operate the remainder of the test circuitry. One side of the winding 12 is connected to an AC detector 32 and to a voltage detector 34.

When test switch 29 is depressed, the standard 115 volt AC impressed across the motor is detected by the AC detector 32, and energizes a buffer and inverter 36 in order to energize a test-in-progress visual indicator 38, labeled T for "test". The output of AC detector 32 also disables a switch 40 which in effect disables the voltage detector 34. After a short test interval t, which is sufficient for the motor rotor speed to approach operating speed, the test switch 29 is opened to disconnect power from the electric motor 10.

The AC detector 32 now enables the switch 40 so as to connect the voltage detector 34 to a memory flip-flop 42. If the rotor was rotated, a residual EMF is now produced as the residual magnetism of the rotor generates a voltage in the stator windings while the rotor 14 comes to a halt. During this time period, the motor 10 is acting as a generator. The generated output voltage of the motor 10 is now detected and amplified by the voltage detector 34 to set the flip-flop 42, thereby enabling a run R visual indicator 44. This indicates that the motor was operative when the AC power was connected to the motor. The memory 42 remains enabled for a time period greatly in excess of the time duration of the residual voltage from the motor.

Should the motor 10 have been inoperative, or should the gear train 18 have caused the rotor shaft 15 to stall, no residual EMF field would be generated and voltage detector 34 would not set the flip-flop 42. As a result, both inputs to a NAND gate 46 would be 0 bits, resulting in a 1 bit output which enables a stall S indicator 50.

Turning to FIG. 2, the circuit shown in block form in FIG. 1 is illustrated in detail. The AC detector 32 comprises a full wave bridge rectifier which includes two light emitting diodes (LEDs) 52 and 53 which are optically coupled to transistors 54 and 55, respectively, A pair of diodes 58 and 59 are coupled across the LEDs 52 and 53, respectively, and complete the full wave bridge. The collectors of the transistors 54, 55 are coupled through a common resistor 62 to a source of +15 volts DC which is supplied from the power supply 30. The collectors are also coupled through a capacitor 64 to a source of reference potential or ground 66. A junction 68 between resistors 62 and capacitor 64 forms the output line for the AC detector.

When transistors 54 and 55 are driven full-on due to current flow through the LEDs 52 and 53, they will in effect connect junction 68 to ground and therefore reduce the voltage across capacitor 64. Thus, when the test button of the switch 29 is depressed, the voltage at junction 68 will appear to be essentially at ground potential. This low voltage is not sufficient to forward bias a diode st ring consisting of diodes 70 and 72 in series with a resistor 73. This causes the switch 40 to remain in its cut-off condition.

While the voltage at junction 68 is low, it provides a low input to a NAND gate 80 which forms a part of the buffer and inverter 36. The output of NAND gate 80 is coupled to the input of another NAND gate 82, and both NAND gates 80 and 82 have their other inputs coupled to a 1 bit source, such as +15 volts DC. The output of NAND gate 82 is coupled through a light emitting diode (LED) 84 and a resistor 86 to the +15 volt DC source. As the junction 68 is held low, the NAND gate 80 produces a 1 bit output which causes NAND gate 82 to have a low output which allows current to flow through the LED 84. This causes an optically coupled SCR 90 to conduct and therefore to connect a neon lamp 38 across the AC source 25, triggering the lamp and producing a visual indication of a test-in-progress.

Voltage detector 34 includes an operational amplifier 100 having its minus (−) and plus (+) inputs coupled across a pair of oppositely poled diodes 102 and 104 which provide voltage limiting so that AC voltages in excess of the breakover potential of the diodes 102 and 104 will not be impressed across the inputs of operational amplifier 100. The (+) input of the operational amplifier input 100 is connected to ground 66, and is also coupled to one side of a resistor 106 which is coupled across the winding 12. The opposite side of resistor 106 is coupled 108 through a resistor 108 a resistor 109 to the (−) input of the operational amplifier 100.

Switch 40 includes a switching transistor 114 having its base coupled to the resistor 73 of the diode string 70, 72 and its collector coupled through a diode 116 to the output of the operational amplifier 100. The emitter of transistor 114 is coupled through a resistor 118 to ground 66. The emitter is also coupled through a resistor 120 to the base of a switching transistor 122 having its collector coupled through a resistor 124 to +15 volts DC. The emitter of transistor 122 is coupled through a resistor 126 to ground 66. A noise filtering capacitor 128 couples the collector of transistor 112 to ground 66.

During the test-in-progress time interval, $t$, the AC line voltage coupled to AC detector 32 is also being coupled to operational amplifier 100. The diodes 102 and 104 are voltage breakover devices which limit the voltage input to the operational amplifier to on the order of 0.6 volt, with resistor 108 dropping most of the high source voltage. The resulting pulsating AC voltage is amplified and fed to the transistor 114, which receives no base drive while the test button 29 is depressed, because of the low voltage maintained at junction 68.

As the operator releases the test button 29, the AC voltage will disappear across resistor 106, and the LEDs 52 and 53 will no longer forward bias the transistors 54 and 55. This allows the voltage at junction 68 to rise positively to a sufficient extent to forward bias the diode string 70, 72 and forward bias the transistor 114. At the same time, the residual AC voltage being generated (if the motor rotor 14 had rotated) is amplified by the amplifier 100 and passed through diode 116 to transistor 114. These conditions bias the transistors 114 and 122 to their fully saturated states, changing the output, after a short time delay produced by capacitor 128, on line 130 to low. This will enable the indicator 44, as will appear. Alternatively, should no residual EMF exist because of a faulty motor, or because of a stalled condition due to an inoperative gear train or the like, no input will be provided to the operational amplifier 100. Therefore, neither of the transistors 114 or 122 will conduct, and switch 42 will not switch states to enable the indicator 44.

When the AC power is turned off, an AC spike may appear across the winding 12, and since this spike will appear whether the motor is good or bad, it could provide a false indication by falsely triggering the flip-flop 42. To prevent this from occurring, the capacitor 128 is provided to provide a delay which will filter out any noise spikes or the like which occur when AC power is disconnected from across the winding of the AC motor.

As the switch 40 is driven on due to junction 68 rising to a high voltage, the NAND gate 80 switches to a 0 bit output which switches NAND gate 82 to a 1 bit output. This blocks current flow through the LED 84 and thus disables energization of the neon lamp indicator 38 in order to indicate that the test is no longer in progress.

Flip-flop 42 consists of a pair of cross-coupled NAND gates 140 and 142, in which NAND gate 140 has a set input coupled to the output line 130 of the switch 40. A reset input of NAND gate 142 is coupled to the output of NAND gate 82. When the line 130 has a low input due to switch 40 being on while a residual AC voltage is detected, the output of NAND gate 140 switches to a 1 bit and the output of NAND gate 142 therefore changes to a 0 bit. This allows current flow through a light emitting diode (LED) 144 so as to trigger and optically couple SCR 146 into conduction and thereby couple AC power across the neon lamp 44. This provides a run indication which remains enabled for a substantially long time period, until the flip-flop 42 is reset due to the output of NAND gate 82 going low which occurs when the test switch 29 is again depressed to connect AC power across the motor.

Should no residual EMF be detected as AC power is removed, then transistor 122 will not be saturated and the output of NAND gate 142 will remain a 1 bit which prevents current flow through the LED 144. This 1 bit is coupled to NAND gate 46 which also has an input from the NAND gate 82. Because AC power is no longer being applied, the output of NAND gate 82 will go to a 1 bit, creating a 0 bit output from NAND gate 46 which allows current flow through a light emitting diode (LED) 150. The LED 150 is optically coupled to trigger an SCR 152 in order to couple AC power across the neon lamp 50 and provide a stall indication.

It should be noted that the motor testing method described above is readily adaptable to automated testing of motors. As no visual inspection is needed the motors can be tested by automatic means. The sensed signal which indicates whether the motor is operable or not can thus be used to actuate equipment which separates defective motors. Thus rather than using visual indicators 44 and 50 other types of devices can be used such as buzzers or automatic equipment.

Having thus described the invention in which an exclusive property or privelege is claimed are defined as follows:

1. A circuit for testing an electric motor, comprising:
   switch means for connecting the electric motor to a source of voltage;
   a residual voltage detector responsive after the switch means has disconnected the electric motor from the voltage source for detecting the presence of a residual voltage generated if the motor had been rotated and is decelerating to a stop;
   a memory having a first input coupled to the residual voltage detector for changing the memory to a first state in response to detection of the residual voltage, the first state existing for a substantially longer time period than the time duration of the residual voltage, the memory further having a reset input responsive to a reset signal for clearing the memory from the first state to a clear state;
   an indicator actuated in response to the first state of the memory for indicating that the electric motor was operative; and
   reset means coupled to the reset input for generating the reset signal when the switch means connects the voltage source to the electric power.

2. The circuit of claim 1 wherein the reset means comprises a source voltage detector coupled to the electric motor for detecting the presence of voltage from the source across the electric motor.

3. The circuit of claim 2 including a test-in-progress indicator actuable to indicate that voltage from the source has been coupled to the motor, and means connecting the source voltage detector to the test-in-progress indicator for actuating the indicator when the presence of voltage from the source is detected.

4. The circuit of claim 2 including second switch means actuable for connecting the residual voltage detector to a set input of the memory, and means coupling the second switch means to the source voltage detector for actuating the second switch means when no voltage from the source is detected by the source voltage detector.

5. A circuit for testing an electric motor, comprising:
   switch means for connecting the electric motor to a source of voltage;
   a residual voltage detector for detecting the presence of a residual voltage generated if the motor had been rotated and is decelerating to a stop;
   a memory for changing to a first state in response to detection of the residual voltage, the first state existing for a substantially longer time period than the time duration of the residual voltage;
   an indicator actuated in response to the first state of the memory for indicating that the electric motor was operative,
   a source voltage detector connected to the electric motor to detect when the switch means has connected the source voltage to the electric motor, and second switch means actuated when no source voltage is detected by the source voltage detector for connecting in circuit the residual voltage detector and the memory.

6. The circuit of claim 5 including a test-in-progress indicator actuable when the voltage source has been coupled to the electric motor, and means coupling the source voltage detector to the test-in-progress indicator for energizing the test-in-progress indicator when source voltage is detected.

7. A circuit for testing an electric motor comprising:
   switch means for connecting the electric motor to a source of voltage;
   a residual voltage detector including an amplifier having an input coupled to the electric motor and an output, and a voltage breakover device shunting the input to a source of reference potential to limit the input voltage to a value not in excess of the breakover voltage of the device, the breakover voltage being substantially less than the source voltage, the amplifier being responsive after the switch means has disconnected the electric motor from the voltage source for amplifying the presence of a residual voltage generated if the motor had been rotated and is decelerating to a stop;
   a memory coupled to the output of the residual voltage detector for changing to a first state in response to the amplified residual voltage, the first state existing for a substantially longer time period than the time duration of the residual voltage; and
   an indicator actuated in response to the first state of the memory for indicating that the electric motor was operative.

8. The circuit of claim 7 including filter means connected between the output of the amplifier and the set input of the memory for eliminating noise spikes which can occur as the switch means disconnects the electric motor from the voltage source.

9. A circuit for testing an electric motor connectable with a source of voltage, comprising:
   switch means for connecting the electric motor to the voltage source;
   a source voltage detector for detecting the presence or absence of source voltage coupled through the switch means to the motor;
   a residual voltage detector for detecting the presence of absence of a residual voltage generated when the motor had been rotated and is decelerating to a stop; and
   error means responsive to the detected absence of the source voltage and the detected absence of the residual voltage for actuating an error indicator to indicate an inoperative motor, said error means effectively enabling the residual voltage detector when the source voltage detector detects the absence of the source voltage, and a switch included in said error means and actuable for connecting the residual voltage detector to an indicator circuit which includes the error indicator, and means for actuating the switch by the source voltage detector in response to the detected absence of source voltage.

10. The circuit of claim 9 wherein the indicator circuit comprises a memory coupled to the switch for changing from a second state to a first state in response to the detected presence of the residual voltage, the first state existing for a substantially longer time period than the time duration of the residual voltage, the error means being responsive to the second state of the memory and the detected absence of source voltage for actuating the error indicator, and a run indicator actuated in response to the first state of the memory for indicating that the electric motor was operative.

* * * * *